United States Patent
Pascualinotto Junior et al.

(10) Patent No.: US 11,910,578 B2
(45) Date of Patent: Feb. 20, 2024

(54) VEHICLE ELECTRONICS COOLING SYSTEMS AND METHODS

(71) Applicant: ContiTech Techno-Chemie GmbH, Karben (DE)

(72) Inventors: Vagner Pascualinotto Junior, Rochester Hills, MI (US); Harald Kreidner, Hann. Muenden (DE); Ilja Makarenko, Vellmar (DE)

(73) Assignee: ContiTech Techno-Chemie GmbH, Karben (DE)

( * ) Notice: Subject to any disclaimer, the term of this patent is extended or adjusted under 35 U.S.C. 154(b) by 16 days.

(21) Appl. No.: 17/448,690

(22) Filed: Sep. 23, 2021

(65) Prior Publication Data
US 2023/0089178 A1    Mar. 23, 2023

(51) Int. Cl.
*H05K 7/20*    (2006.01)

(52) U.S. Cl.
CPC .............................. *H05K 7/20872* (2013.01)

(58) Field of Classification Search
CPC ................................................ H05K 7/20872
USPC .................................................... 361/679.46
See application file for complete search history.

(56) References Cited

U.S. PATENT DOCUMENTS

| | | | |
|---|---|---|---|
| 4,551,787 A * | 11/1985 | Mittal | H01L 23/3735 257/E23.098 |
| 5,293,070 A * | 3/1994 | Burgess | H01L 23/473 361/689 |
| 6,411,512 B1 | 6/2002 | Mankaruse et al. | |
| 6,687,126 B2 | 2/2004 | Patel et al. | |
| 6,942,018 B2 * | 9/2005 | Goodson | F28D 15/00 174/15.1 |
| 6,992,382 B2 * | 1/2006 | Chrysler | H01L 23/473 361/689 |
| 7,149,087 B2 * | 12/2006 | Wilson | H01L 23/473 174/15.1 |
| 7,188,662 B2 * | 3/2007 | Brewer | H01L 23/473 257/E23.098 |

(Continued)

FOREIGN PATENT DOCUMENTS

EP    0514141 B1    8/1995

OTHER PUBLICATIONS

The International Search Report and the Written Opinion of the International Searching Authority dated Nov. 23, 2022 for the counterpart PCT Application No. PCT/EP2022/074803.

*Primary Examiner* — Anatoly Vortman
(74) *Attorney, Agent, or Firm* — Gregory Adams

(57) ABSTRACT

One general aspect includes a hybrid thermal management system for vehicle electronics. The hybrid thermal management system also includes a bottom piece being injection molded and may include of polymer, the bottom piece may include a plurality of coolant channels, an input port and an output port. The hybrid thermal management system also includes a thermal plate covering the bottom piece and the plurality of coolant channels and configured to dissipate thermal energy from a vehicle high performance computing (HPC) to a coolant within the plurality of coolant channels. The hybrid thermal management system also includes the input port configured to supply the coolant to the plurality of coolant channels. The hybrid thermal management system also includes the output port configured to collect coolant from the plurality of coolant channels and convey thermal energy away from the system.

12 Claims, 3 Drawing Sheets

(56) References Cited

U.S. PATENT DOCUMENTS

| | | | | |
|---|---|---|---|---|
| 7,254,030 | B2* | 8/2007 | Chiba | H01L 23/473 |
| | | | | 361/710 |
| 7,316,263 | B2 | 1/2008 | Lofland et al. | |
| 7,336,487 | B1* | 2/2008 | Chrysler | H01L 23/473 |
| | | | | 361/679.48 |
| 7,339,788 | B2* | 3/2008 | Olesen | H05K 7/20927 |
| | | | | 257/E23.098 |
| 7,495,916 | B2 | 2/2009 | Shiao et al. | |
| 7,764,494 | B2* | 7/2010 | Balzano | H01L 23/473 |
| | | | | 361/689 |
| 7,836,597 | B2* | 11/2010 | Datta | H01L 21/4882 |
| | | | | 29/890.032 |
| 8,369,090 | B2* | 2/2013 | Chester | H05K 7/20763 |
| | | | | 165/80.4 |
| 8,422,229 | B2* | 4/2013 | Madison, Jr. | F28F 3/12 |
| | | | | 361/698 |
| 8,938,880 | B2* | 1/2015 | Loong | H01L 23/473 |
| | | | | 29/890.03 |
| 9,812,377 | B2* | 11/2017 | Yamada | H01L 23/473 |
| 9,845,999 | B2* | 12/2017 | Matsushima | F28F 3/022 |
| 2002/0162673 | A1 | 11/2002 | Cook | |
| 2007/0256810 | A1* | 11/2007 | Di Stefano | H01L 23/473 |
| | | | | 257/E23.098 |
| 2009/0129011 | A1* | 5/2009 | Balzano | H01L 23/473 |
| | | | | 361/689 |
| 2016/0116224 | A1* | 4/2016 | Shedd | F28F 13/02 |
| | | | | 165/104.22 |
| 2018/0290547 | A1* | 10/2018 | Myers | F25B 49/00 |
| 2019/0077276 | A1* | 3/2019 | Capati | H05K 7/20872 |
| 2019/0343019 | A1 | 11/2019 | Todorovic | |
| 2020/0266578 | A1* | 8/2020 | Durse | B60L 53/302 |
| 2021/0392780 | A1* | 12/2021 | Adam | H05K 7/2049 |

* cited by examiner

VEHICLE ELECTRONICS COOLING SYSTEMS AND METHODS

FIELD

The field to which the disclosure generally relates is vehicle electronics.

BACKGROUND

Vehicles of today include a wide variety of electronics systems. These systems can include engine electronics, safety electronics, driver assistance and the like. These electronics perform many useful functions, however they generally create substantial amount of heat.

This heat can degrade electronics operation and degrade or damage other aspects of the vehicle.

One technique to mitigate the generated heat is to utilize passive cooling. This technique involves mounting the electronics on a sheet of metal configured to partially dissipate the generated heat.

However, this passive cooling may not be sufficient to handle the vehicle electronics of today.

Techniques are needed that better dissipate generated heat in vehicle electronics.

DETAILED DESCRIPTION

Figure 1:
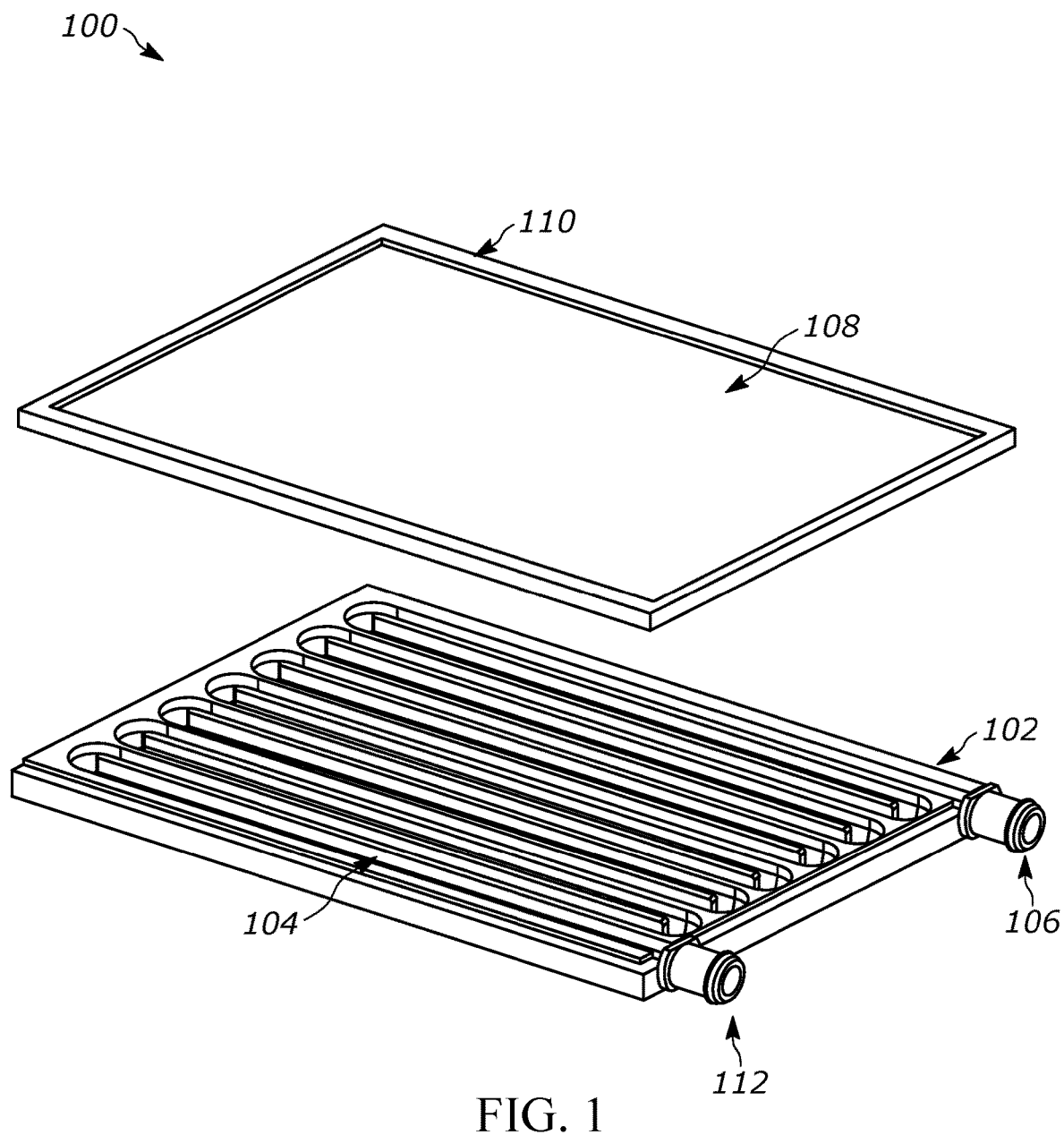
FIG. 1 is a diagram illustrating a hybrid thermal management system 100 for vehicle electronics in accordance with one or more embodiments.

The following description of the variations is merely illustrative in nature and is in no way intended to limit the scope of the disclosure, its application, or uses. The description is presented herein solely for the purpose of illustrating the various embodiments of the disclosure and should not be construed as a limitation to the scope and applicability of the disclosure. In the summary of the disclosure and this detailed description, each numerical value should be read once as modified by the term "about" (unless already expressly so modified), and then read again as not so modified unless otherwise indicated in context. Also, in the summary of the disclosure and this detailed description, it should be understood that a value range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to only a few specific data points, it is to be understood that inventors appreciate and understand that any and all data points within the range are to be considered to have been specified, and that inventors had possession of the entire range and all points within the range.

Unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of concepts according to the disclosure. This description should be read to include one or at least one, and the singular also includes the plural unless otherwise stated.

The terminology and phraseology used herein is for descriptive purposes and should not be construed as limiting in scope. Language such as "including", "comprising", "having", "containing", or "involving", and variations thereof, is intended to be broad and encompass the subject matter listed thereafter, equivalents, and additional subject matter not recited.

Also, as used herein, any references to "one embodiment" or "an embodiment" means that a particular element, feature, structure, or characteristic described in connection with the embodiment is included in at least one embodiment. The appearances of the phrase "in one embodiment" in various places in the specification are not necessarily referring to the same embodiment.

Vehicles of today include a wide variety of electronics systems. These systems can include engine electronics, safety electronics, driver assistance and the like. These electronics perform many useful functions, however they generally create substantial amount of heat.

This heat can degrade electronics operation and degrade or damage other aspects of the vehicle.

One technique to mitigate the generated heat is to utilize passive cooling. This technique involves mounting the electronics on a sheet of metal configured to partially dissipate the generated heat.

However, this passive cooling may not be sufficient to handle the vehicle electronics of today.

Techniques are needed that better dissipate generated heat in vehicle electronics.

FIG. 1 is a diagram illustrating a hybrid thermal management system 100 for vehicle electronics in accordance with one or more embodiments. The system 100 is provided for illustrative purposes and it is appreciated that suitable variations are contemplated.

Electronic modules or electronics are present in vehicles. These electronics typically generate heat or thermal energy during their operation. In particular, the vehicle electronics include high performance computing (HPC), which tend to generate substantial thermal energy. HPCs include, for example, the use of parallel processing for running advanced application programs efficiently, reliably and quickly.

Due to packaging, these modules often have limited area to dissipate the heat generated by the internal components, therefore, passive cooling elements (eg., heatsink) which by the increased area of fins dissipates the heat to the ambient primarily by convection are used.

In personal computers (PCs) an active fan is often used to create a forced airflow to improve the heat rejection of the system. However, due to the limited space in vehicles, active fan cooling is not generally feasible.

Furthermore, the recent developments in Advanced Driver Assistance Systems (ADAS) technologies and the emerging development of Battery Electric and Autonomous vehicles has increased the demand for high performance computing to channel the car's communication to both embedded sensors and the outside world.

The system 100 is used in vehicle systems to provide suitable or selected active cooling using a coolant that is circulated to dissipate thermal energy away from the vehicle electronics. The coolant is a suitable material configured to convey thermal energy, such as Water, Deionized Water, Inhibited Glycol and Water Solutions, Dielectric Fluids and the like.

The vehicle systems include internal combustion and hybrid/electric systems. The hybrid systems include Mild Hybrids, Full Hybrids, Plug-In Hybrids and the like.

The vehicle electronics include engine electronics, transmission electronics, chassis electronics, passive safety electronics, passenger comfort electronics, entertainment system electronics, driver assistance (self driving) electronics and the like.

It is appreciated that driver assistance/self driving electronics are used in self driving mode in autonomous vehicles (AV or auto), driverless car, or robo-car (robotic car), which is a vehicle that is capable of sensing its environment and moving safely with little or no human input. Self-driving electronics combine a variety of sensors to perceive their surroundings, such radar, lidar, sonar, GPS, odometry and inertial measurement units. Advanced control systems interpret sensory information to identify appropriate navigation paths, as well as obstacles and relevant signage.

Self/autonomous driving can generate more thermal energy and thus, the system 100 can be adjusted to mitigate the greater thermal energy.

The hybrid system 100 can be stand alone or integrated directly to the HPC/electronic module/vehicle electronics allowing its active cooling.

The hybrid system 100 includes a thermal plate 108 and a bottom piece 102 that are attached.

The bottom piece 102 has a plurality of cooling channels 104 that convey the liquid coolant from an input port 106 to an output port 112. The cooling channels 104 are shown having an S-type configuration, however other suitable configurations such as zig-zag, bio-inspired Murray's law, and the like are contemplated.

The cooling channels 104 can be based on Murray's law, which predicts the thickness of branches in transport networks, such that the cost for transport and maintenance of the transport medium is minimized/reduced. This law is observed in the vascular and respiratory systems of animals, xylem in plants, and the respiratory system of insects.

The coolant absorbs and conveys thermal energy from the thermal plate 108, which in turn conveys thermal energy from vehicle electronics (not shown) proximate the thermal plate 108. As a result, thermal energy from the vehicle electronics are dissipated by the hybrid system 100.

The bottom piece is comprised of a suitable material, such as an injection molded polymer, die cast aluminum and the like.

The thermal plate 108 comprises one or more layers 109 of a thermally conductive material, such as diamond, silver, copper, gold, silicon carbide, beryllium oxide, aluminum, tungsten, graphite, zinc, alloys thereof and the like.

The thermal plate 108 includes an overmold 110 configured to facilitate attachment to the bottom piece 102. The overmold 110 can also be an injection molded polymer, die cast aluminum and the like. The overmold 110 can be adhered/attached to the thermal plate 108. In one example, the thermal plate 108 and/or the overmold 110 is welded to the bottom piece 102. In another example, the thermal plate 108 and/or the overmold 110 is attached to the bottom piece 102 via an adhesive or glue. Other suitable techniques are contemplated.

The system 100 can be configured for various sizes, thickness, cooling channels to enable flexible and scalable solutions.

For example, the cooling channels can be configured to provide greater thermal transfer from the thermal plate 108 at portions proximate a HPC.

It is appreciated that the system 100 can be used for thermal management of vehicle electronics and other types of electronics, such as personal computers, mobile phones, portable devices and the like.

Figure 2:
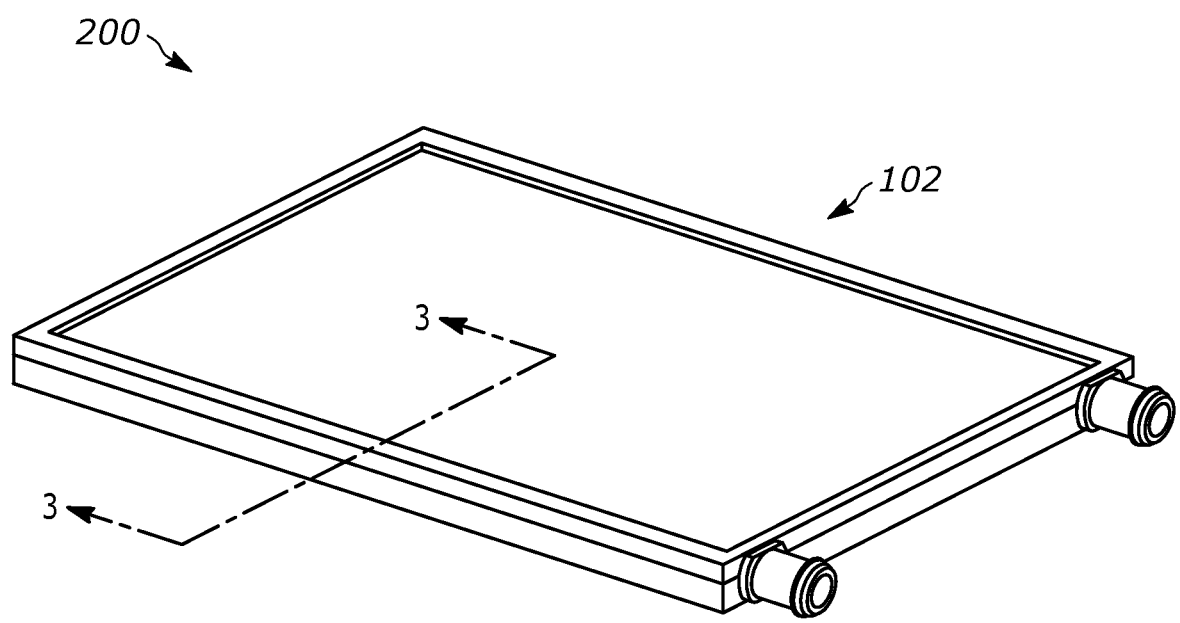
FIG. 2 is a diagram illustrating the hybrid thermal management system 100, 200 for vehicle electronics in accordance with one or more embodiments.

FIG. 2 is a diagram illustrating the hybrid thermal management system 100, 200 for vehicle electronics in accordance with one or more embodiments. The system 200 is provided for illustrative purposes and it is appreciated that suitable variations are contemplated.

The hybrid system 100, 200 is shown having the thermal plate 108 attached to the bottom piece 102.

Cross sectional lines 3-3 are also shown.

Figure 3:
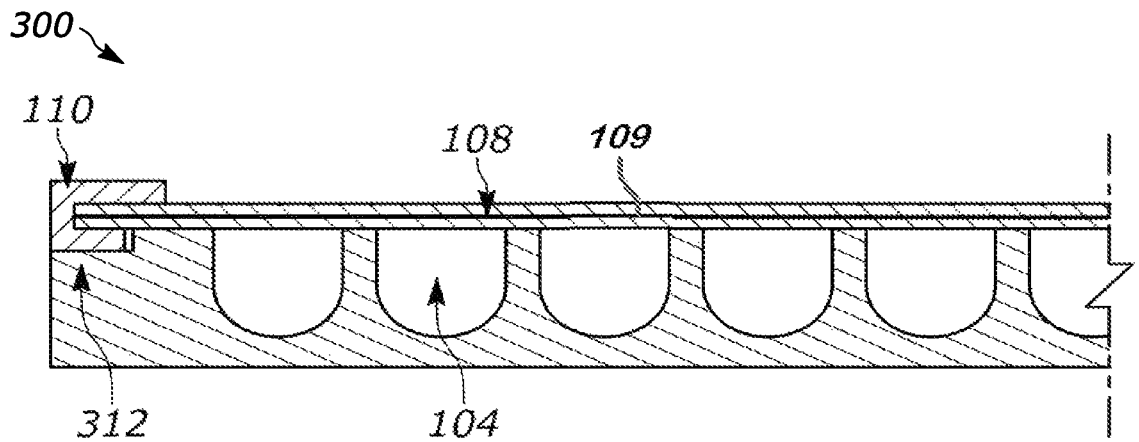
FIG. 3 is a diagram illustrating a cross sectional view of the hybrid thermal management system 100, 200, 300 for vehicle electronics in accordance with one or more embodiments.

FIG. 3 is a diagram illustrating a cross sectional view of the hybrid thermal management system 100, 200, 300 for vehicle electronics in accordance with one or more embodiments. The system 300 is provided for illustrative purposes and it is appreciated that suitable variations are contemplated.

The system 300 shows the overmold 110 attached 312 to the bottom piece 102. The 312 can be an adhesive, weld and the like.

The cooling channels 104 are shown having a U-shaped design. It is appreciated that the cooling channels 104 can have other suitable shapes.

The thermal plate 108 has a selected thickness based on its application. In one example, the thermal plate 108 has a suitable thickness of 0.5 to 3.5 mili-meters (mm).

Figure 4:
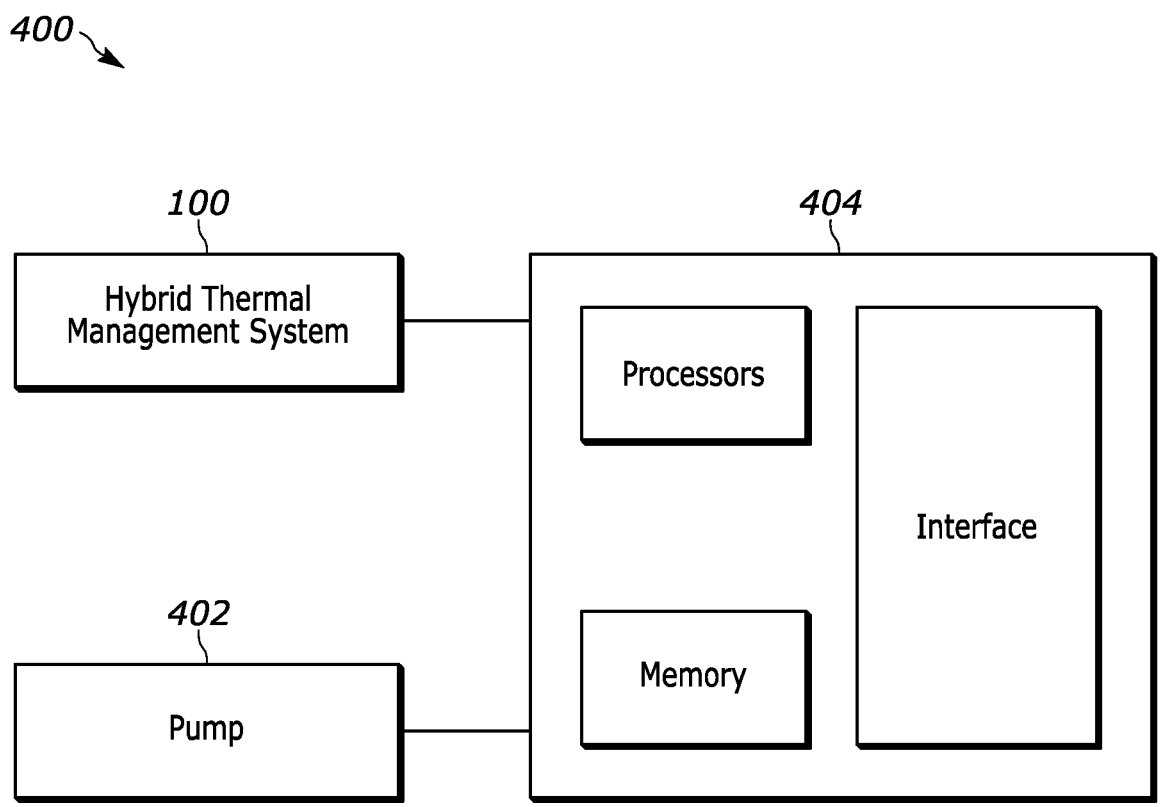
FIG. 4 is a diagram illustrating the hybrid thermal management system 100 as part of a cooling system 400.

FIG. 4 is a diagram illustrating the hybrid thermal management system 100 as part of a cooling system 400.

The system 400 includes the hybrid thermal management system 100, a coolant pump 402 and a controller 404.

The coolant pump 402 is configured to cause coolant to flow through the hybrid system 100.

The controller 404 includes one or more processors, a memory and an interface. The one or more processors are configured to control operation of the coolant pump 402. The interface is configured to send and receive vehicle information. The memory can store the vehicle information.

The foregoing description of the embodiments has been provided for purposes of illustration and description. Example embodiments are provided so that this disclosure will be sufficiently thorough, and will convey the scope to those who are skilled in the art. Numerous specific details are set forth such as examples of specific components, devices, and methods, to provide a thorough understanding of embodiments of the disclosure, but are not intended to be exhaustive or to limit the disclosure. It will be appreciated that it is within the scope of the disclosure that individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Also, in some example embodiments, well-known processes, well-known device structures, and well-known technologies are not described in detail. Further, it will be readily apparent to those of skill in the art that in the design, manufacture, and operation of apparatus to achieve that described in the disclosure, variations in apparatus design, construction, condition, erosion of components, gaps between components may present, for example.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus, system, and the like to perform the actions.

One general aspect includes a hybrid thermal management system for vehicle electronics. The hybrid thermal management system also includes a bottom piece being injection molded and may include of polymer, the bottom piece may include a plurality of coolant channels, an input port and an output port. The hybrid thermal management system also includes a thermal plate covering the bottom piece and the plurality of coolant channels and configured to dissipate thermal energy from a vehicle high performance computing (HPC) to a coolant within the plurality of coolant channels. The hybrid thermal management system also includes the input port configured to supply the coolant to the plurality of coolant channels. The hybrid thermal management system also includes the output port configured to collect coolant from the plurality of coolant channels and convey thermal energy away from the system.

Implementations may include one or more of the following features. The system the vehicle HPC being part of engine electronics. The vehicle HPC being part of driver assistance electronics. The coolant channels having an s-shaped configuration. The coolant channels configured to provide greater cooling at a selected location of the thermal plate. The coolant channels having a u-shape design. The thermal plate may include aluminum. The thermal plate may include of one or more layers, the one or more layers may include of aluminum and/or copper. The thermal plate may include an overmold about its edges, the overmold configured to facilitate attachment to the base piece. The thermal plate having a thickness of about 1.5 mm. The thermal plate having a thickness of 0.5 to 3.5 mm. The system may include a pump coupled to the input port and configured to supply the coolant. The system may include a thermal dissipation device, the device being a radiator. The system may include a controller having one or more processors configured to control flow rates of the coolant through the coolant channels. The system the one or more processors configured to increase flow rates of the coolant upon a vehicle entering self driving mode. Implementations of the described techniques may include hardware, a method or process, or computer software on a computer-accessible medium.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first", "second", and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially-relative terms, such as "inner", "adjacent", "outer", "beneath", "below", "lower", "above", "upper", and the like, may be used herein for ease of description to describe one element or feature's relationship to another element(s) or feature(s) as illustrated in the figures. Spatially-relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially-relative descriptors used herein interpreted accordingly.

Although a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims.

What is claimed is:

1. A hybrid thermal management system for electronics, the system comprising:
    a bottom piece being injection molded and comprised of polymer, the bottom piece comprising a plurality of coolant channels, an input port and an output port;
    a thermal plate covering the bottom piece and the plurality of coolant channels, comprised of metal and configured to dissipate thermal energy from a computing device to a coolant within the plurality of coolant channels;
    the thermal plate comprising a plurality of layers of thermally conductive material including aluminum;
    the thermal plate is not injection molded;
    an overmold comprised of die cast aluminum and attached to the thermal plate and the bottom piece;
    the input port configured to supply the coolant to the plurality of coolant channels; and
    the output port configured to collect the coolant from the plurality of coolant channels and convey thermal energy away from the system.

2. The system of claim 1, the coolant channels having an S-shaped configuration.

3. The system of claim 1, the coolant channels configured to provide greater cooling at a selected location than another location of the thermal plate.

4. The system of claim 1, the coolant channels having a U-shape design.

5. The system of claim 1, the thermal plate comprised of aluminum.

6. The system of claim 1, the thermal plate comprised of one or more layers, the one or more layers comprised of aluminum and/or copper.

7. The system of claim 1, the overmold configured to facilitate attachment of the thermal plate to the base piece.

8. The system of claim 1, the thermal plate having a thickness of about 1.5 mm.

9. The system of claim 1, the thermal plate having a thickness of 0.5 to 3.5 mm.

10. The system of claim 1, further comprising a pump coupled to the input port and configured to supply the coolant.

11. The system of claim 1, further comprising a controller having one or more processors configured to control flow rates of the coolant through the coolant channels.

12. The system of claim 1, the overmold having a U shape around an edge of the thermal plate and setting in a recess of the bottom piece.

\* \* \* \* \*